United States Patent
Candes et al.

(10) Patent No.: US 7,890,842 B2
(45) Date of Patent: Feb. 15, 2011

(54) COMPUTER-IMPLEMENTED METHOD FOR CORRECTING TRANSMISSION ERRORS USING LINEAR PROGRAMMING

(75) Inventors: Emmanuel Candes, Los Angeles, CA (US); Terence Tao, Los Angeles, CA (US)

(73) Assignees: California Institute of Technology, Pasadena, CA (US); The Regents of the University of California, Oakland, CA (US)

( * ) Notice: Subject to any disclaimer, the term of this patent is extended or adjusted under 35 U.S.C. 154(b) by 1058 days.

(21) Appl. No.: 11/344,951

(22) Filed: Jan. 31, 2006

(65) Prior Publication Data

US 2007/0016837 A1 Jan. 18, 2007

Related U.S. Application Data

(60) Provisional application No. 60/652,992, filed on Feb. 14, 2005.

(51) Int. Cl.
H03M 13/00 (2006.01)
(52) U.S. Cl. .................................................... 714/781
(58) Field of Classification Search ................. 714/781
See application file for complete search history.

(56) References Cited

U.S. PATENT DOCUMENTS 4,633,471 A * 12/1986 Perera et al. ................. 714/758
4,763,331 A * 8/1988 Matsumoto .................. 714/759
6,366,941 B1 * 4/2002 Wolf et al. .................... 708/492
6,728,295 B1 * 4/2004 Nallanathan et al. ........ 375/140
7,003,713 B2 * 2/2006 Rodgers ...................... 714/768
7,092,451 B2 * 8/2006 Andrews ..................... 375/267
7,257,170 B2 * 8/2007 Love et al. ................... 375/340

OTHER PUBLICATIONS

Chase, D.; Class of algorithms for decoding block codes with channel measurement information, IEEE Transactions on Information Theory, vol. 18, Issue 1, Jan. 1972 pp. 170-182.*
S. Boyd, and L. Vandenberghe, Convex Optimization, Cambridge University Press, 2004.*
Z. D. Bai, Y. Q. Yin, "Limit of the Smallest Eigenvalue of a Large Dimensional Sample Covariance Matrix," *Annals of Probability*, vol. 21, No. 3 (Jul. 1993), pp. 1275-1294.
Bruckstein, A.M., Elad, M., "A generalized uncertainty principle and sparse representation in pairs of $R^N$ bases," *IEEE Transactions on Information Theory*, 48, pp. 2558-2567 (2002).

(Continued)

*Primary Examiner*—Joseph D Torres
(74) *Attorney, Agent, or Firm*—Steinfl & Bruno LLP (57) ABSTRACT

A computer-implemented method for correcting transmission errors. According to the method, a transmitted vector corrupted by error can be recovered solving a linear program. The method has applications in the transmission of Internet media, Internet telephony, and speech transmission. In addition, error correction is embedded as a key building block in numerous algorithms, and data-structures, where corruption is possible; corruption of digital data stored on a hard-drive, CD, DVD or similar media is a good example. In short, progress in error correction has potential to impact several storage and communication systems.

7 Claims, 3 Drawing Sheets

OTHER PUBLICATIONS

Candes, E.J., et al., "Robust uncertainty principles: exact signal reconstruction from highly incomplete frequency information", To appear on IEEE Transactions on Information Theory, Available at http://arvix.org/abs/math.NA/0409186, Feb. 2006.

Candes, E.J., Tao, T., "Near Optimal signal recovery from random projectionsand universal encoding strategies" submitted to IEEE Transactions on Information Theory, Oct. 2004, available at http://arvix.org/abs/math.CA/0410542.

Candes, E.J., Romberg, J., "Quantitative Robust Uncertainty Principles and Optimally Sparse Decompositions," To appear in Foundations of Computational Mathematics, Nov. 2004, available at http://arvix.org/abs/math.CA/0411273.

Chen, S.S, Basis Pursuit, Stanford Ph. ~D~ Thesis (1995).

Chen, S.S., et al., "Atomic decomposition by basis pursuit," *Society for Industrial and Applied Mathematics Journal of Computing* 20, pp. 33-61 (1999).

Coifman, F., et al., "Noiselets," *Applied and Computational Harmonic Analysis*, 10(1):27-44, 2001.

Davidson, K.R., Szarek, S.J., "Local operator theory, random matrices and Banach spaces," Handool in Banach Spaces, vol. 1, pp. 317-366 (2001).

Donoho, D.L., "For most large underdetermined systems of linear equations the minimal $l_1$-norm solution is also the sparsest solution," Manuscript, Sep. 2004, available at http://www-stat.stanford.edu/~donoho/reports.html.

Donoho, D.L., "Compressed Sensing," Manuscript, Sep. 2004, available at http://www-stat.stanford.edu/~donoho/reports.html.

Donoho, D.L., Elad, M., "Optimally sparse representation in general (nonorthogonal) dictionaries via $l_1$ minimization," Proc. Natl. Acad. Sci. USA, 100, pp. 2197-2202 (2003).

Donoho, D.L., Huo, X., "Uncertainty Principles and ideal atomic decomposition" *IEEE Transactions on Information Theory*, 47, pp. 2845-2862 (2001).

El Karoui, N., "Recent results about the largest eigenvalue of random covariance matrices and statistical application," *Acta Physica Polonica B*, vol. 36, No. 9,pp. 2681-2697 (2005).

Geman, S., "A limit theorem for the norm of random matrices," *The Annals Probability*, vol. 8, No. 2, pp. 252-261 (1980).

Gribonval, R., Nielsen, M., "Sparse representations in unons bases," *IEEE Trasactions on Information Theory*, 49, pp. 3320-3325 (2003).

Johnstone, M., "Large covariance matrices," Third 2004 Wald Lecture, 6th World congress of the Bernoulli society and 67th Annual Meeting of the IMS, Barcelona (Jul. 2004).

Ledoux, M., "The concentration of measure phenomenon," Mathematical Surveys and Monographs 89, american Mathematical Society (2001).

Marchenko, V.A., Pastur, L.A., "Distribution of eigenvalues in certain sets of random matrices," Mat. Sb. (N.S.) 72, pp. 407-535 (in Russian) (1967).

Muirhead, R.J., "Aspects of multivariate statistical theory," Wiley Series in Probability and Mathematical Statistics, John Wiley & Sons, Inc., New York (1982).

Natarajan, B.K., "Sparse approximate solutions to linear systems," *Society for Industrial and Applied Mathematics Journal of Computing*, vol. 24, pp. 227-234 (1995).

Silverstein, J.W., "The smallest eigenvalue of a large dimensional Wishart matrix," *Annals of Probability*, vol. 13, No. 4 pp. 1364-1368 (1985).

Szarek, S.J., "Condition numbers of random matrices," J. Complexity 7, pp. 131-149 (1991).

Tropp, J.A., "Greed is good: Algorithmic results for sparse approximation," *IEEE Transactions on Information Theory*, vol. 50, No. 10, pp. 2231-2242 (Oct. 2004).

Wachter, K.W., "The limiting empirical measure of multiple discriminant ratios," *The Annals of Statistics*, vol. 8, No. 5, pp. 937-957 (1980).

* cited by examiner

FIG. 5

COMPUTER-IMPLEMENTED METHOD FOR CORRECTING TRANSMISSION ERRORS USING LINEAR PROGRAMMING

CROSS-REFERENCE TO RELATED APPLICATIONS

This application claims the benefit of U.S. provisional Patent Application Ser. No. 60/652,992, filed Feb. 14, 2005 for "Error Correction Using Linear Programming" by Emmanuel Candes and Terence Tao, the disclosure of which is incorporated herein by reference.

FEDERAL SUPPORT

This invention was made with U.S. Government support under grant No. DMS 01-40698 (FRG) awarded by the National Science Foundation. The U.S. Government has certain rights in this invention.

BACKGROUND

1. Field

The present disclosure relates to a method for correcting errors. In particular, it relates to a computer-implemented method for correcting transmission errors in a physical system.

2. Related Art

Finding sparse solutions to underdetermined systems of linear equations—a problem of great importance in signal processing, and design of robust communication channels—is in general NP-hard [9,21]. For example, the sparsest solution is given by $$(P_0) \min_{d \in R^m} \|d\|_{l_0} \text{ subject to } Fd = \tilde{y}(= Fe)$$

and solving this problem essentially requires exhaustive searches over all subsets of columns of F, a procedure which clearly is combinatorial in nature and has exponential complexity.

This computational intractability has recently led researchers to develop alternatives to $(P_0)$, and a frequently discussed approach considers a similar program in the $l_1$-norm which goes by the name of Basis Pursuit [6]:

$$(P_1) \min_{d \in R^m} \|d\|_{l_1} \text{ subject to } Fd = \tilde{y}$$

where we recall that $$\|d\|_{l_1} = \sum_{i=1}^m |d_i|.$$

Unlike the $l_0$-norm which enumerates the nonzero coordinates, the $l_1$-norm is convex. It is also well-known [7] that $(P_1)$ can be recast as a linear program (LP).

Motivated by the problem of finding sparse decompositions of special signals in the field of mathematical signal processing and following upon the groundbreaking work of Donoho and Huo [11], a series of beautiful articles [16,12, 13,14,24] showed exact equivalence between the two programs $(P_0)$ and $(P_1)$. In a nutshell, it has been shown that for m/2 by m matrices F obtained by concatenation of two orthonormal bases, the solution to both $(P_0)$ and $(P_1)$ are unique and identical provided that in the most favorable case, the vector e has at most $0.914\sqrt{m/2}$ nonzero entries. This is of little practical use here since we are interested in procedures that might recover a signal when a constant fraction of the output is unreliable.

Using very different ideas and together with Romberg [3], the applicants proved that the equivalence holds with overwhelming probability for various types of random matrices provided that the number of nonzero entries in the vector e be of the order of m/log m [4,5]. In the special case where F is an m/2 by m random matrix with independent standard normal entries, [9] proved that the number of nonzero entries may be as large as $\rho \cdot m$, where $\rho > 0$ is some very small and unspecified positive constant independent of m.

SUMMARY

The present application considers the model problem of recovering an input vector $f \in R^n$ from corrupted measurements y=Af+e. Here, A is an m by n matrix (we will assume throughout that m>n), and e is an arbitrary and unknown vector of errors. The problem considered by the applicants is whether it is possible to recover f exactly from the data y. And if so, how?

In its abstract form, this problem is of course equivalent to the classical error correcting problem which arises in coding theory as A may be thought of as a linear code; a linear code is a given collection of codewords which are vectors $a_1, \ldots, a_n \in R^m$—the columns of the matrix A. Given a vector $f \in R^n$ (the plaintext), a vector Af in $R^m$ (the ciphertext) can be generated; we refer to the transformation from f to Af as the encoding scheme. If A has full rank, then one can clearly recover the plaintext f from the ciphertext Af by standard linear algebra methods. But now we suppose that the ciphertext Af is corrupted by an arbitrary vector $e \in R^m$ giving rise to the corrupted ciphertext Af+e. The question is then: given the coding matrix A and Af+e, can one recover f exactly?

As is well-known, if the fraction of the corrupted entries is too large, then of course there is no hope of reconstructing f from Af+e; for instance, assume that m=2n and consider two distinct plaintexts f, f' and form a vector $g \in R^m$ by setting half of its m coefficients equal to those of Af and half of those equal to those of Af'. Then g=Af+e=Af'+e' where both e and e' are supported on sets of size at most n=m/2. This simple example shows that accurate decoding is impossible when the size of the support of the error vector is greater or equal to a half of that of the output Af. Therefore, a common assumption in the literature is to assume that only a small fraction of the entries are actually damaged:

$$\|e\|_{l_0} := |\{i : e_i \neq 0\}| \leq \rho \cdot m.$$

For which values of $\rho$ can we hope to reconstruct e with practical algorithms? That is, with algorithms whose complexity is at most polynomial in the length m of the code A? We refer to such algorithms as decoding schemes.

To decode f, note that it is obviously sufficient to reconstruct the vector e since knowledge of Af+e together with e gives Af, and consequently f since A has full rank. The decoding scheme of the present application is then as follows. The applicants construct a matrix which annihilates the m by n matrix A on the left, i.e. such that FA=0. This can be done by taking a matrix F whose kernel is the range of A in $R^m$, which is an n-dimensional subspace (e.g. F could be the orthogonal projection onto the cokernel of A). Then apply F to the output y=Af+e to obtain $$\tilde{y} = F(Af+e) = Fe$$

since FA=0. Therefore, the decoding problem is reduced to that of reconstructing a sparse vector e from the observations Fe (by sparse, the applicants mean that only a fraction of the entries of e are nonzero).

Therefore, the present application shows that a novel method that enables decoding of a transmitted vector of data in the presence of corruption of the original values.

According to a first aspect, a computer-implemented method for correcting transmission errors is provided, comprising the steps of: transmitting a vector using a linear code, said vector becoming corrupted by error upon transmission; and recovering the vector by solving a linear program in form of a convex optimization problem $$\min_{x \in R^n} \|y - Ax\|_{l_1},$$

wherein y is the corrupted vector, A is a coding matrix expressing the linear code, and $l_1$ is a norm such that $$\|x\|_{l_1} := \sum_i |x_i|.$$

According to a second aspect, a computer system for simulating a physical process is disclosed, comprising: means for storing in memory a received vector y, said received vector being corrupted by error; means for storing in memory a linear code A used to transmit said received vector; means for storing in memory a solution vector x; means for performing operations on A, x and y, the operations comprising performing $$\min_{x \in R^n} \|y - Ax\|_{l_1}$$

wherein $l_1$ represents a norm such that $$\|x\|_{l_1} := \sum_i |x_i|$$

According to a third aspect, a method for transmitting packets over a communication network is disclosed, comprising: encoding the packets using a coding matrix; transmitting the encoded packets; and decoding the transmitted encoded packets by solving a linear program $$\min_{x \in R^n} \|y - Ax\|_{l_1},$$

wherein A is the coding matrix, y is a vector expressing the transmitted encoded packets and $l_1$ represents a norm such that $$\|x\|_{l_1} := \sum_i |x_i|.$$

The present application is relevant in the design of practical communication networks (especially those of a digital nature) over noisy channels, as for instance arises in Internet, telephony, or electromagnetic communications. For instance, if a data vector is encoded using a random matrix A (thus expanding the length of the data, say by a factor of 4) and then each component of the ciphertext thus obtained is sent through the Internet as a separate packet, one can tolerate a fixed fraction (say 30%) of the packets being lost, corrupted, or delayed, and still be able to reconstruct the original data exactly. Of course, the matrix A has to be known for data recovery to work, but A can be generated by both transmitter and receiver through a standard random number generator with some previously agreed upon seed. It should be remarked that even if an adversary has the ability to choose which packets to destroy or corrupt, and what data to replace them with, this does not affect the ability to reconstruct the data so long as the adversary is only able to affect a fixed fraction of the packets. Also, as the protocol is non-adaptive, there is no need to query the transmitter at any stage in order to perform recovery; in particular, the data can be collected passively and decoded at some convenient later date. Note that because one is likely to recover the data in perfect condition, one can safely pre-process the data (e.g. by compressing it) even if such pre-processing is very sensitive to the change of even a single bit of the data.

The present application also has relevance to robust data storage and recovery protocols. Traditional error-correcting storage protocols, such as those employed on modern CDs and DVDs, allow one to tolerate small amounts of damage (such as scratches), and even large damage will corrupt only a fraction of the data. The algorithm presented here can achieve a similar performance (by dividing the data into blocks and applying the algorithm on each block separately), but can also scale to increase the robustness of the data, at the cost of speed of recovery. In the most extreme case, when the entire contents of a DVD are encoded as a single unit, (thus increasing reducing the capacity of the data by a factor of two to four, though this can be compensated for somewhat by first compressing the data), the data can then be recovered perfectly as long as no more than 10%-30% of the disk is damaged, though recovery in this case may take a significant amount of time (e.g. months) due the need to perform an immense amount of linear algebra. Again, the location of the damage is not important; deleting a consecutive sector of 30% of the disk can be handled just as easily as damage to 30% of the disk that is distributed randomly. Also, as before, one can safely pre-process the data in any desired manner.

Both the encoding and decoding aspects of the algorithm in accordance with the present disclosure can be easily and efficiently implemented in any computer architecture. The encoding scheme, being the application of a single linear matrix f↦Af, is extremely fast and can even be performed by very simple, low-power devices at high speeds. One can for instance imagine a "smart dust" application consisting of a large number of cheap devices measuring some data (represented mathematically as a vector f), with each device recording and then transmitting a single component of Af, thus the sole purpose of each device is to perform and then transmit a single random linear measurement (together with some identifying code to signify which component of Af is being transmitted). Even if a significant fraction of these devices fail, are jammed, or are compromised to transmit false data, the algorithm will still be able to recover f perfectly. The decoding scheme, requiring the solution of a linear program, does require more computational power, but standard library packages can easily implement this program in an efficient manner, and for data of small size (e.g. vectors of at most 1024 entries in length) the decoding is essentially instantaneous. It is conceivable that in some cases where the data is of large size (e.g. several million entries), one could take advantage of parallel processing techniques to speed up the decoding.

The democratic nature of LP codes makes them particularly well-suited for distributing data to multiple recipients. Suppose, for example, that we wish to distribute a large piece of data from a satellite to many different users. The LP code for this data can be divided into small packets, which are in turn broadcast to the users. The quality of the channel between the satellite and each user could be very different, and could change over time, meaning that each user will successfully receive a different subset of the packets. Their ability to decode the data, however, depends only on the *number* of packets received, and not at all on *which* packets are received. Successful transmission is possible even though there is no feedback from any of the users about which packets are missing. Another possible application is robust distributed storage. Suppose a large file is LP coded, divided into packets, and then distributed over an array. If some of the disks fail, the data can still be retrieved from the subset of packets still available.

BRIEF DESCRIPTION OF THE DRAWINGS

FIG. 5 shows a possible example of a computer (100) embodying the method in accordance with the present disclosure. The computer (100) comprises a memory (110) and a processor (120). The memory (110) can store a received vector corrupted by error a liner code used to transmit the received vector, and a solution vector. The processor (120) can perform operations on the stored variables by way of the method described herein.

DETAILED DESCRIPTION

The present application introduces the concept of a restrictedly almost orthonormal system—a collection of vectors which behaves like an almost orthonormal system but only for sparse linear combinations. Thinking about these vectors as the columns of the matrix F, the applicants show that this condition allows for the exact reconstruction of sparse linear combination of these vectors, i.e. e. The applicants' results are significantly different than those mentioned above as they are deterministic and do not involve any kind of randomization, although they can of course be specialized to random matrices. For instance, it shall be shown that a Gaussian matrix with independent entries sampled from the standard normal distribution is restrictedly almost orthonormal with overwhelming probability, and that minimizing the $l_1$-norm recovers sparse decompositions with a number of nonzero entries of size $\rho_0 \cdot m$; the applicants shall actually give numerical values for $\rho_0$.

The applicants presented the connection with sparse solutions to underdetermined systems of linear equations merely for pedagogical reasons. There is a more direct approach. To decoded from corrupted data y=Af+e, we consider solving the following $l_1$-minimization problem $$(P'_1) \min_{g \in R^n} \|y - Ag\|_{l_1}.$$

Now f is the unique solution of $(P_1')$ if and only if e is the unique solution of $(P_1)$. In other words, $(P_1)$ and $(P_1')$ are equivalent programs. To see why these is true, observe on the one hand that since y=Af+e, we may decompose g as g=f+h so that $$(P'_1) \Leftrightarrow \min_{h \in R^n} \|e - Ah\|_{l_1}.$$

On the other hand, the constraint Fx=Fe means that x=e−Ah for some h ∈ R$^n$ and, therefore, $$(P_1) \Leftrightarrow \min_{h \in R^n} \|x\|_{l_1}, x = e - Ah \Leftrightarrow \min_{h \in R^n} \|e - Ah\|_{l_1}$$

which proves the claim.

The decoding procedure $(P_1')$ may also be re-expressed as a Linear Program (LP)—hence the title of the present application. Indeed, the $l_1$-minimization problem is equivalent to $$\min 1^T t, -t \leq y - Ag \leq t, \quad (1)$$

where the optimization variables are t ∈ R$^m$ and g ∈ R$^n$ (as is standard, the generalized vector inequality x≤y means that $x_i \leq y_i$ for all i). As a result, the decoding procedure ($P_1'$) is a LP with inequality constraints and can be solved efficiently using standard optimization algorithms, see [2].

Restricted Isometries

In the remainder of the present application, it will be convenient to use some linear algebra notations. We denote by $(v_j)_{j \in J} \in R^p$ the columns of the matrix F and by H the Hilbert space spanned by these vectors. Further, for any $T \subseteq J$, we let $F_T$ be the submatrix with column indices $j \in T$ so that $$F_T c = \sum_{j \in T} c_j v_j \in H.$$

To introduce the notion of an almost orthonormal system, the applicants first observe that if the columns of F are sufficiently "d egenerate", the recovery problem cannot be solved. In particular, if there exists a non-trivial sparse linear combination $$\sum_{j \in T} c_j v_j = 0$$

of the $v_j$ which sums to zero, and $T=T_1 \cup T_2$ is any partition of T into two disjoint sets, then the vector $$y := \sum_{j \in T_1} c_j v_j = \sum_{j \in T_2} (-c_j) v_j$$

has two distinct sparse representations. On the other hand, linear dependencies $$\sum_{j \in J} c_j v_j = 0$$

which involve a large number of nonzero coefficients $c_j$, as opposed to a sparse set of coefficients, do not present an obvious obstruction to sparse recovery. At the other extreme, if the $(v_j)_{j \in J}$ are an orthonormal system, then the recovery problem is easily solved by setting $$c_j := \langle f, v_j \rangle_H.$$

In present application, if a "restricted orthonormality hypothesis", which is far weaker than assuming orthonormality, is imposed, then ($P_1$) solves the recovery problem, even if the $(v_j)_{j \in J}$ are highly linearly dependent (for instance, it is possible for m:=|J| to be much larger than the dimension of the span of the $v_j$'s). To make this quantitative the following definition is introduced.

Definition. (Restricted isometry constants) Let F be the matrix with the finite collection of vectors $(v_j)_{j \in J} \in R^p$ as columns. For every integer $1 \leq S \leq |J|$, we define the S-restricted isometry constants $\delta_S$ to be the smallest quantity such that $F_T$ obeys $$(1-\delta_S)\|c\|^2 \leq \|F_T c\|^2 \leq (1+\delta_S)\|c\|^2 \tag{2}$$

for all subsets $T \subset J$ of cardinality at most S, and all real coefficients $(c_j)_{j \in T}$. Similarly, we define the (S,S')-restricted orthogonality constants $\theta_{S,S'}$ for $S+S' \leq |J|$ to be the smallest quantity such that $$|\langle F_T c, F_{T'} c' \rangle| \leq \theta_{S,S'} \cdot \|c\| \|c'\| \tag{3}$$

holds for all disjoint sets $T,T' \subseteq J$ of cardinalities $|T| \leq S$ and $|T'| \leq S'$.

The numbers $\delta_S$ and $\theta_{S,S'}$ measure how close the vectors $v_j$ are to behaving like an orthonormal system, but only when restricting attention to sparse linear combinations involving no more than S vectors. These numbers are clearly non-decreasing in S, S'. For S=1, the value $\delta_1$ only conveys magnitude information about the vectors $v_j$; indeed $\delta_1$ is the best constant such that $$1-\delta_1 \leq \|v_j\|_H^2 \leq 1+\delta_1 \text{ for all } j \in J.$$

In particular, $\delta_1=0$ if and only if all of the $v_j$ have unit length. We will later show that the higher $\delta_S$ control the orthogonality numbers $\theta_{S,S'}$:

Lemma 1. We have $\theta_{S,S'} \leq \delta_{S+S'} \leq \theta_{S,S'} + \max(\delta_S, \delta_{S'})$ for all S,S'.

To see the relevance of the restricted isometry numbers $\delta_S$ to the sparse recovery problem, consider the following simple observation:

Lemma 2. Suppose that $S \geq 1$ is such that $\delta_{2S}<1$, and let $T \subset J$ be such that $|T| \leq S$. Let $f := F_T c$ for some arbitrary |T|-dimensional vector c. Then the set T and the coefficients $(c_j)_{j \in T}$ can be reconstructed uniquely from knowledge of the vector f and the $v_j$'s.

Proof. We prove that there is a unique c with $\|c\|_{\ell_0} \leq S$ obeying $$f = \sum_j c_j v_j,$$

Suppose for contradiction that f had two distinct sparse representations $f=F_T c = F_{T'} c'$ where $|T|, |T'| \leq S$.

Then $$F_{T \cup T'} d = 0, \quad d_j := c_j 1_{j \in T} - c'_j 1_{j \in T'}.$$

Taking norms of both sides and applying (2) and the hypothesis $\delta_{2S}<1$ we conclude that $\|d\|^2=0$, contradicting the hypothesis that the two representations were distinct.

Main Results

The previous lemma is an abstract existence argument which shows what might theoretically be possible, but does not supply any efficient algorithm to recover T and $c_j$ from f and the $v_j$ other than by brute force search—as discussed earlier. In contrast, the main result is that, by imposing slightly stronger conditions on the restricted isometry constants, the $l_1$-minimization program ($P_1$) decodes f exactly.

Theorem 3. Suppose that $S \geq 1$ is such that $$\delta_S + \theta_S + \theta_{S,2S} < 1, \tag{4}$$

and let c be a real vector supported on a set $T \subset J$ obeying $|T| \leq S$. Put f:=Fc. Then c is the unique minimizer to $$(P_1) \min \|d\|_{l_1} : Fd = f.$$

Note from Lemma 1 that (4) implies that $\delta_{2S}<1$, and is in turn implied by $\delta_S+S_{2S}+S_{3S}<¼$. Thus the condition (4) is roughly "three times as strict" as the condition required for Lemma 2.

Theorem 3 is inspired by the applicants' previous work [4], see also [3,5], but unlike those earlier results, the applicants' results here are deterministic, and thus do not have a non-zero probability of failure, provided of course one can ensure that the $v_j$ verify the condition (4). By virtue of the previous discussion, we have the companion result:

Theorem 4. Suppose F is such that FA=0 and let S≧1 be a number obeying the hypothesis of Theorem 3. Set y=Af+e, where e is a real vector supported on a set of size at most S. Then f is the unique minimizer to $$(P_1') \min_{g \in R''} \|y - Ag\|_{l_1}.$$

Gaussian Random Matrices

An important question is to find matrices with good restricted isometry constants, i.e. such that (4) holds for large values of S. Indeed, such matrices will tolerate a larger fraction of output in error while still allowing exact recovery of the original input by linear programming. How to construct such matrices might be delicate. In a later section, however, the applicants will argue that generic matrices, namely samples from the Gaussian unitary ensemble obey (4) for relatively large values of S.

Theorem 5. Assume p≦m and let F be a p by m matrix whose entries are i.i.d. Gaussian with mean zero and variance 1/p. Then the condition of Theorem 3 holds with overwhelming probability provided that r=S/m is small enough so that $$r < r^*(p,m)$$

where $r^*(p,m)$ is given in (12). (By "with overwhelming probability", we mean with probability decaying exponentially in m.) In the limit of large samples, $r^*(p,m)$ only depends upon the ratio, and numerical evaluations show that the condition holds for r≦3.6×10$^{-4}$ in the case where p/m=¾, r≦3.2×10$^{-4}$ when p/m=⅔, and r≦2.3×10$^{-4}$ when p/m=½.

In other words, Gaussian matrices are a class of matrices for which one can solve an underdetermined systems of linear equations by minimizing $l_1$ provided, of course, the input vector has fewer than ρ·m nonzero entries with ρ>0. The applicants mentioned earlier that this result is similar to [9]. What is new and non-obvious here is that by using a very different machinery, one can obtain explicit numerical values which were not available before.

In the context of error correcting, the consequence is that a fraction of the output may be corrupted by arbitrary errors and yet, solving a convex problem would still recover f exactly—a rather unexpected feat.

Corollary. Suppose A is an n by m Gaussian matrix and set p=m-n. Under the hypotheses of Theorem 5, the solution to ($P_1'$) is unique and equal to f.

This is an immediate consequence of Theorem 5. The only thing we need to argue is why we may think of the annihilator F (such that FA=0) as a matrix with independent Gaussian entries. Observe that the range of A is a random space of dimension n embedded in $R^m$ so that the data $\tilde{y}$=Fe is the projection of e on a random space of dimension p. The range of a p by m matrix with independent Gaussian entries precisely is a random subspace of dimension p, which justifies the claim.

The applicants would like to point out that the theoretical bounds derived in the present application are overly conservative; numerical experiments have shown that the error tolerance that the algorithm can handle in fact exceeds the theoretical bounds by one or two orders of magnitude.

Proof of Main Results

The main result, namely, Theorem 3 is proved by duality. As it will be seen in a later section, c is the unique minimizer if the matrix $F_T$ has full rank and if one can find a vector w with the two properties $$\langle w, v_j \rangle_H = \operatorname{sgn}(c_j) \text{ for all } j \in T, \quad 1.$$

$$\text{and } |\langle w, v_j \rangle_H| < 1 \text{ for all } j \notin T, \quad 2.$$

where sgn($c_j$) is the sign of $c_j$ (it equals zero when $c_j$=0). The two conditions 1, 2 above say that a specific dual program is feasible and is called the exact reconstruction property in [4]}, see also [3]. For |T|≦S with S obeying the hypothesis of Theorem 3, $F_T$ has full rank since $\delta_S<1$ and thus, the proof simply consists in constructing a dual vector w; this is the object of the next section.

Exact Reconstruction Property

The applicants now examine the sparse reconstruction property and begin with coefficients $\langle w, v_j \rangle_H$ for $j \notin T$ being only small in an $l_2$ sense.

Lemma 6. (Dual sparse reconstruction property, $l_2$ version) Let S,S'≧1 be such that $\delta_S<1$, and c be a real vector supported on T ⊂ J such that |T|≦S. Then there exists a vector w ∈ H such that $\langle w, v_j \rangle_H = c_j$ for all j ∈ T. Furthermore, there is an "exceptional set" E ⊆ J which is disjoint from T, of size at most |E|≦S', and with the properties $$|\langle w, v_j \rangle| \le \frac{\theta_{S,S'}}{(1-\delta_S)\sqrt{S'}} \cdot \|c\| \text{ for all } j \notin T \cup E$$

and $$\left( \sum_{j \in E} |\langle w, v_j \rangle|^2 \right)^{1/2} \le \frac{\theta_S}{1-\delta_S} \cdot \|c\|.$$

In addition, $\|w\|_H \le K \cdot \|c\|$ for some constant K>0 only depending upon $\delta_S$.

Proof. Recall that $F_T: l_2(T) \to H$ is the linear transformation $$F_T c_T := \sum_{j \in T} c_j v_j$$

where $c_T:=(c_j)_{j \in T}$ (we use the subscript T in $c_T$ to emphasize that the input is a |T|-dimensional vector), and let $F_T^*$ be the adjoint transformation $$F_T^* w := (\langle w, v_j \rangle_H)_{j \in T}.$$

Property 1 gives $$1 - \delta_S \le \lambda_{min}(F_T^* F_T) \le \lambda_{max}(F_T^* F_T) \le 1 + \delta_S,$$

where $\lambda_{min}$ and $\lambda_{max}$ are the minimum and maximum eigenvalues of the positive-definite operator $F_T^* F_T$. In particular, since $\delta_{|T|}<1$, we see that $F_T^* F_T$ is invertible with $$\|(F_T^* F_T)^{-1}\| \leq \frac{1}{1-\delta_S}.$$ (5)

Also note that $$\|F_T(F_T^* F_T)^{-1}\| \leq \frac{\sqrt{1+\delta_S}}{1-\delta_S}$$

and set $w \in H$ to be the vector $$w := F_T(F_T^* F_T)^{-1} c_T;$$

it is then clear that $F_T^* w = c_T$, i.e. $\langle w, v_j \rangle_H = c_j$ for all $j \in T$. In addition, $\|w\| \leq K \cdot \|c_T\|$ with $$K := \frac{\sqrt{1+\delta_S}}{1-\delta_S}.$$

Finally, if T' is any set in J disjoint from T with $|T'| \leq S'$ and $d_{T'} = (d_j)_{j \in T'}$ is any sequence of real numbers, then (3) and (5) give $$\begin{aligned}|\langle F_{T'}^* w, d_{T'} \rangle_{l_2(T')}| &= |\langle w, F_{T'} d_{T'} \rangle_{l_2(T')}| \\ &= \left| \left\langle \sum_{j \in T} ((F_T^* F_T)^{-1} c_T)_j v_j, \sum_{j \in T'} d_j v_j \right\rangle_H \right| \\ &\leq \theta_{S,S'} \cdot \|(F_T^* F_T)^{-1} c_T\| \cdot \|d_{T'}\| \\ &\leq \frac{\theta_{S,S'}}{1-\delta_S} \|c_T\| \cdot \|d_{T'}\|; \end{aligned}$$

since $d_{T'}$ was arbitrary, we thus see from duality that $$\|F_{T'}^* w\|_{l_2(T')} \leq \frac{\theta_{S,S'}}{1-\delta_S} \|c_T\|.$$

In other words, $$\left( \sum_{j \in T'} |\langle w, v_j \rangle|^2 \right)^{1/2} \leq \frac{\theta_{S,S'}}{1-\delta_S} \|c_T\| \text{ whenever } T' \subseteq J \setminus T \text{ and } |T'| \leq S'.$$ (6)

If in particular if we set $$E := \left\{ j \in J \setminus T; |\langle w, v_j \rangle| > \frac{\theta_{S,S'}}{(1-\delta_S)\sqrt{S'}} \cdot \|c_T\| \right\},$$

then $|E|$ must obey $|E| \leq S'$, since otherwise we could contradict (6) by taking a subset T' of E of cardinality S'. The claims now follow.

The applicants now derive a solution with better control on the sup norm of $|\langle w, v_j \rangle|$ outside of T, by iterating away the exceptional set E (while keeping the values on T fixed).

Lemma 7. (Dual sparse reconstruction property, $l_\infty$ version)

Let $S \geq 1$ be such that $\delta_S + \theta_{S,2S} < 1$, and c be a real vector supported on $T \subset J$ obeying $|T| \leq S$. Then there exists a vector $w \in H$ such that $\langle w, v_j \rangle_H = c_j$ for all $j \in T$. Furthermore, w obeys $$|\langle w, v_j \rangle_H| \leq \frac{\theta_S}{(1-\delta_S - \theta_{S,2S})\sqrt{S}} \cdot \|c\| \text{ for all } j \notin T$$ (7)

Proof. We may normalize $$\sum_{j \in T} |c_j|^2 = \sqrt{S}.$$

Write $T_0 := T$. Using Lemma 6, we can find a vector $w_1 \in H$ and a set $T_1 \subseteq J$ such that $$T_0 \cap T_1 = \emptyset$$

$$|T_1| \leq S$$

$$\langle w_1, v_j \rangle_H = c_j$$

for all $$j \in T_0$$

$$|\langle w_1, v_j \rangle_H| \leq \frac{\theta_{S,S'}}{1-\delta_S}$$

for all $$j \notin T_0 \cup T_1$$

$$\left( \sum_{j \in T_1} |\langle w_1, v_j \rangle_H|^2 \right)^{1/2} \leq \frac{\theta_S}{1-\delta_S} \sqrt{S}$$

$$\|w_1\|_H \leq K.$$

Applying Lemma 6 iteratively gives a sequence of vectors $w_{n+1} \in H$ and sets $T_{n+1} \subseteq J$ for all $n \geq 1$ with the properties $$T_n \cap (T_0 \cup T_{n+1}) = \emptyset$$

$$|T_{n+1}| \leq S$$

$$\langle w_{n+1}, v_j \rangle_H = \langle w_n, v_j \rangle_H$$

for all $$j \in T_n$$

$$\langle w_{n+1}, v_j \rangle_H = 0$$

for all $$j \in T_0$$

$$|\langle w_{n+1}, v_j \rangle_H| \leq \frac{\theta_S}{1-\delta_S} \left( \frac{\theta_{S,2S}}{1-\delta_S} \right)^n$$

for all $$j \notin T_0 \cup T_n \cup T_{n+1}$$

$$\left( \sum_{j \in T_{n+1}} |\langle w_{n+1}, v_j \rangle|^2 \right)^{1/2} \leq \frac{\theta_S}{1-\delta_S} \left( \frac{\theta_{S,2S}}{1-\delta_S} \right)^n \sqrt{S}$$

-continued $$\|w_{n+1}\|_H \le \left(\frac{\theta_S}{1-\delta_S}\right)^{n-1} K.$$

By hypothesis, we have $$\frac{\theta_{S,2S}}{1-\delta_S} \le 1.$$

Thus if we set $$w := \sum_{n=1}^{\infty} (-1)^{n-1} w_n \qquad (8)$$

then the series is absolutely convergent and, therefore, w is a well-defined vector in H. We now study the coefficients $$\langle w, v_j \rangle_H = \sum_{n=1}^{\infty} (-1)^{n-1} \langle w_n, v_j \rangle_H \qquad (8)$$

for $j \in J$.

Consider first $j \in T_0$, it follows from the construction that $\langle w_1, v_j \rangle_H = c_j$ and $\langle w_n, v_j \rangle_H = 0$ for all $n > 1$, and hence $$\langle w, v_j \rangle_H = c_j \text{ for all } j \in T_0.$$

Second, fix j with $j \notin T_0$ and let $I_j := \{n \ge 1 : j \in T_n\}$. Since $T_n$ and $T_{n+1}$ are disjoint, we see that the integers in the set $I_j$ are spaced at least two apart. Now if $n \in I_j$, then by definition $j \in T_n$ and, therefore, $$\langle w_{n+1}, v_j \rangle_H = \langle w_n, v_j \rangle_H$$

In other words, the n and n+1 terms in (8) cancel each other out. Thus we have $$\langle w, v_j \rangle_H = \sum_{\substack{n \ge 1 \\ n, n-1 \notin I_j}} (-1)^{n-1} \langle w_n, v_j \rangle_H.$$

On the other hand, if $n, n-1 \notin I_j$ and $n \ne 0$, the $j \notin T_n \cap T_{n-1}$ and $$|\langle w_n, v_j \rangle| \le \frac{\theta_S}{1-\delta_S} \left(\frac{\theta_{S,2S}}{1-\delta_S}\right)^{n-1}$$

which by the triangle inequality and the geometric series formula gives $$\left|\sum_{\substack{n \ge 1 \\ n, n-1 \notin I_j}} (-1)^{n-1} \langle w_n, v_j \rangle_H\right| \le \frac{\theta_S}{1-\delta_S-\theta_{S,2S}}.$$

-continued $$|\langle w, v_j \rangle_H - 1_{0 \in I_j} \langle w_0, v_j \rangle_H| \le \frac{\theta_S}{1-\delta_S-\theta_{S,2S}},$$

In conclusion, and since $|T| \le S$, the claim follows.

Lemma 7 actually solves the dual recovery problem. Indeed, the applicants' result states that one can find a vector $w \in H$ obeying both properties 1 and 2 stated at the beginning of the section. To see why 2 holds, observe that $\|\text{sgn}(c)\| = \sqrt{|T|} \le \sqrt{S}$ and, therefore, (7) gives for all $j \notin T$ $$|\langle w, v_j \rangle_H| \le \frac{\theta_S}{1-\delta_S-\theta_{S,2S}} \cdot \sqrt{\frac{|T|}{S}} \le \frac{\theta_S}{1-\delta_S-\theta_{S,2S}} < 1$$

provided that (4) holds.

Proof of Theorem 3

Observe first that standard convex arguments give that there exists at least one minimizer $d = (d_j)_{j \in J}$ to the problem ($P_1$). We need to prove that $d = c$. Since c obeys the constraints of this problem, d obeys $$\|d\|_{l_1} \le \|c\|_{l_1} = \sum_{j \in T} |c_j|. \qquad (9)$$

Now take a w obeying properties 1 and 2 (see the remark following Lemma 7). Using the fact that the inner product $\langle w, v_j \rangle_H$ is equal to the sign of c on T and has absolute value strictly less than one on the complement, we then compute $$\|d\|_{l_1} = \sum_{j \in T} |c_j + (d_j - c_j)| + \sum_{j \notin T} |d_j| \ge$$
$$\sum_{j \in T} \text{sgn}(c_j)(c_j + (d_j - c_j)) + \sum_{j \notin T} d_j \langle w, v_j \rangle_H =$$
$$\sum_{j \in T} |c_j| + \sum_{j \in T} (d_j - c_j) \langle w, v_j \rangle_H + \sum_{j \notin T} d_j \langle w, v_j \rangle_H =$$
$$\sum_{j \in T} |c_j| + \left\langle w, \sum_{j \in J} d_j v_j - \sum_{j \in T} c_j v_j \right\rangle_H = \sum_{j \in T} |c_j| \langle w, f - f \rangle_H = \sum_{j \in T} |c_j|.$$

Comparing this with (9) we see that all the inequalities in the above computation must in fact be equality. Since $\langle w, v_j \rangle_H$ was strictly less than 1 for all $j \in T$, this in particular forces $d_j = 0$ for all $j \notin T$. Thus $$\sum_{j \in T} (d_j - c_j) v_j = f - f = 0.$$

Applying (2) (and noting from hypothesis that $\delta_S < 1$) we conclude that $d_j = c_j$ for all $j \in T$. Thus $d = c$ as claimed. This concludes the proof of the applicants' t theorem.

It is likely that one may push the condition (4) a little further. The key idea is as follows. Each vector $w_n$ in the iteration scheme used to prove Lemma 7 was designed to annihilate the influence of $w_{n-1}$ on the exceptional set $T_{n-1}$.

But annihilation is too strong of a goal. It would be just as suitable to design $w_n$ to moderate the influence of $w_{n-1}$ enough so that the inner product with elements in $T_{n-1}$ is small rather than zero.

Approximate Orthogonality

Lemma 1 gives control of the size of the principal angle between subspaces of dimension S and S' respectively. This is useful because it allows one to guarantee exact reconstruction from the knowledge of the δ numbers only.

Proof of Lemma 1. The applicants first show that $\theta_{S,S'} \leq \delta_{S+S'}$. By homogeneity it will suffice to show that $$\left| \left\langle \sum_{j \in T} c_j v_j, \sum_{j' \in T'} c'_{j'} v_{j'} \right\rangle \right| \leq \delta_{S+S'}$$

whenever $|T| \leq S$, $|T'| \leq S'$, T, T' are disjoint, and $$\sum_{j \in T} |c_j|^2 = \sum_{j' \in T'} |c'_{j'}|^2 = 1.$$

Now (2) gives $$2(1 - \delta_{S+S'}) \leq \left\| \sum_{j \in T} c_j v_j + \sum_{j' \in T'} c'_{j'} v_{j'} \right\|_H^2 \leq 2(1 + \delta_{S+S'})$$

together with $$2(1 - \delta_{S+S'}) \leq \left\| \sum_{j \in T} c_j v_j - \sum_{j' \in T'} c'_{j'} v_{j'} \right\|_H^2 \leq 2(1 + \delta_{S+S'})$$

and the claim now follows from the parallelogram identity.

It remains to show that $\delta_{S+S'} \leq \theta_{S,S'} + \max(\delta_S, \delta_{S'})$. Again by homogeneity, it suffices to establish that $$\left| \left\langle \sum_{j \in \tilde{T}} c_j v_j, \sum_{j' \in \tilde{T}} c_{j'} v_{j'} \right\rangle_H - 1 \right| \leq \max(\delta_S, \delta_{S'}) + \theta_{S,S'}$$

whenever $|\tilde{T}| \leq S + S'$ and $$\sum_{j \in \tilde{T}} |c_j|^2 = 1.$$

To prove this property, we partition $\tilde{T}$ as $\tilde{T} = T \cup T'$ where $|T| \leq S$ and $|T'| \leq S'$ and write $$\sum_{j \in T} |c_j|^2 = \alpha \text{ and } \sum_{j \in T'} |c_j|^2 = 1 - \alpha.$$

(2) together with (3) give $$(1 - \delta_S)\alpha \leq \left\langle \sum_{j \in T} c_j v_j, \sum_{j' \in T} c_{j'} v_{j'} \right\rangle_H \leq (1 + \delta_S)\alpha$$

$$(1 - \delta_{S'})(1 - \alpha) \leq \left\langle \sum_{j \in T'} c_j v_j, \sum_{j' \in T'} c_{j'} v_{j'} \right\rangle_H \leq (1 + \delta_{S'})(1 - \alpha)$$

$$\left| \left\langle \sum_{j \in T} c_j v_j, \sum_{j' \in T'} c_{j'} v_{j'} \right\rangle_H \right| \leq \theta_{S,S'} \alpha^{1/2} (1 - \alpha)^{1/2}.$$

Hence $$\left| \left\langle \sum_{j \in \tilde{T}} c_j v_j, \sum_{j' \in \tilde{T}} c_{j'} v_{j'} \right\rangle_H - 1 \right| \leq$$

$$\delta_S \alpha + \delta_{S'}(1 - \alpha) + 2\theta_{S,S'} \alpha^{1/2} (1 - \alpha)^{1/2} \leq \max(\delta_S, \delta_{S'}) + \theta_{S,S'}$$

as claimed.

Gaussian Random Matrices

In this section, the applicants argue that with overwhelming probability, Gaussian random matrices have "good" isometry constants. Consider a p by m matrix F whose entries are i.i.d. Gaussian with mean zero and variance 1/p and let T be a subset of the columns. We wish to study the extremal eigenvalues of $F_T^* F_T$. Following upon the work of Marchenko and Pastur [18], Geman [15] and Silverstein [22] (see also [1]) proved that $$\lambda_{min}(F_T^* F_T) \to (1 - \sqrt{\gamma})^2 \text{ a.s.}$$

$$\lambda_{max}(F_T^* F_T) \to (1 + \sqrt{\gamma})^2 \text{ a.s.}$$

in the limit where p and $|T| \to \infty$ with $|T|/p \to \gamma \leq 1$. In other words, this says that loosely speaking and in the limit of large p, the restricted isometry constant $\delta(F_T)$ for a fixed T behaves like $$1 - \delta(F_T) \leq \lambda_{min}(F_T^* F_T) \leq \lambda_{max}(F_T^* F_T) \leq 1 + \delta(F_T),$$
$$\delta(F_T) \approx 2\sqrt{|T|/p} + |T|/p.$$

Restricted isometry constants must hold for all sets T of cardinality less or equal to S, and the applicants shall make use of concentration inequalities to develop such a uniform bound. Note that for T' ⊂ T, one obviously has $$\lambda_{min}(F_T^* F_T) \leq \lambda_{min}(F_{T'}^* F_{T'}) \leq \lambda_{max}(F_{T'}^* F_{T'}) \leq \lambda_{max}(F_T^* F_T)$$

and, therefore, attention may be restricted to matrices of size S. Now, there are large deviation results about the singular values of $F_T$ [23]. For example, letting $\sigma_{max}(F_T) := \lambda_{max}(F_T^* F_T)^{1/2}$ be the largest singular value of $F_T$, and defining $\sigma_{min}(F_T)$ similarly, Ledoux [18] applies the concentration inequality for Gaussian measures, and for a fixed t>0, obtains the deviation bounds $$P(\sigma_{max}(F_T) > 1 + \sqrt{|T|/p} + o(1) + t) \leq e^{-pt^2/2} \quad (10)$$

$$P(\sigma_{min}(F_T) < 1 - \sqrt{|T|/p} - o(1) - t) \leq e^{-pt^2/2}; \quad (11)$$

here, o(2) is a small term tending to zero as p→∞ and which can be calculated explicitly, see [14]. For example, this last reference shows that one can select o(2) in (10) as $$\frac{1}{2p^{1/3}} \cdot \gamma^{1/6}(1+\sqrt{\gamma})^{2/3}.$$

Lemma 8. Put r:=S/m and set $$f(r):=\sqrt{m/p} \cdot (\sqrt{r}+\sqrt{2H(r)}),$$

where H is the entropy function $H(q):=-q \log q - (1-q)\log(1-q)$ defined for $0<q<1$. For each $\epsilon>0$ the restricted isometry constant $\delta_S$ of a p by m Gaussian matrix F obeys $$P(1+\delta_S>[1+(1+\epsilon)f(r)]^2) \leq 2 \cdot e^{-mH(r)\cdot\epsilon/2}.$$

Proof. As discussed above, we may restrict the applicants' attention to sets |T| such that |T|=S. Denote by $\eta_p$ the o(2)-term appearing in either (10) or (11). Put $\lambda_{max}:=\lambda_{max}(F_T^*F_T)$ for short, and observe that $$P\left(\sup_{T:|T|=S} \lambda_{max} > \left(1+\sqrt{S/p}+\eta_p+t\right)^2\right) \leq$$

$$|\{T:|T|=S\}|P(\lambda_{max} > (1+\sqrt{S/p}+\eta_p+t)^2) \leq \binom{m}{S}e^{-pt^2/2}.$$

From Stirling's approximation $\log m! = m \log m - m + O(\log m)$ we have the well-known formula $$\log\binom{m}{S} = mH(r) + O(\log m)$$

which gives $$P\left(\sup_{T:|T|=S} \lambda_{max} > (1+\sqrt{S/p}+\eta_p+t)^2\right) \leq e^{mH(r)} \cdot e^{O(\log m)} \cdot e^{-pt^2/2}.$$

The exact same argument applied to the smallest eigenvalues yields $$P\left(\inf_{T:|T|=S} \lambda_{min} < (1-\sqrt{S/p}+\eta_p+t)^2\right) \leq e^{mH(r)} \cdot e^{O(\log m)} \cdot e^{-pt^2/2}.$$

Fix $\eta_p+t=(1+\epsilon)\cdot\sqrt{m/p}\cdot\sqrt{2H(r)}$. Assume now that m and p are large enough so that $$\eta_p \leq \frac{\epsilon}{2} \cdot \sqrt{m/p} \cdot \sqrt{2H(r)}.$$

Then $$P\left(\sup_{T:|T|=S} \lambda_{max} > \left(1+\sqrt{S/p}+\epsilon\cdot\sqrt{m/p}\cdot\sqrt{2H(r)}\right)^2\right) \leq e^{mH(r)\cdot\epsilon/2}$$

where we used the fact that the term O(log m) is less than m$\epsilon$H(r)/2 for sufficiently large m. The same bound holds for the minimum eigenvalues and the claim follows.

Ignoring the $\epsilon$'s, Lemma 8 states that with overwhelming probability $$\delta_S < -1+[1+f(r)]^2.$$

Figure 1:
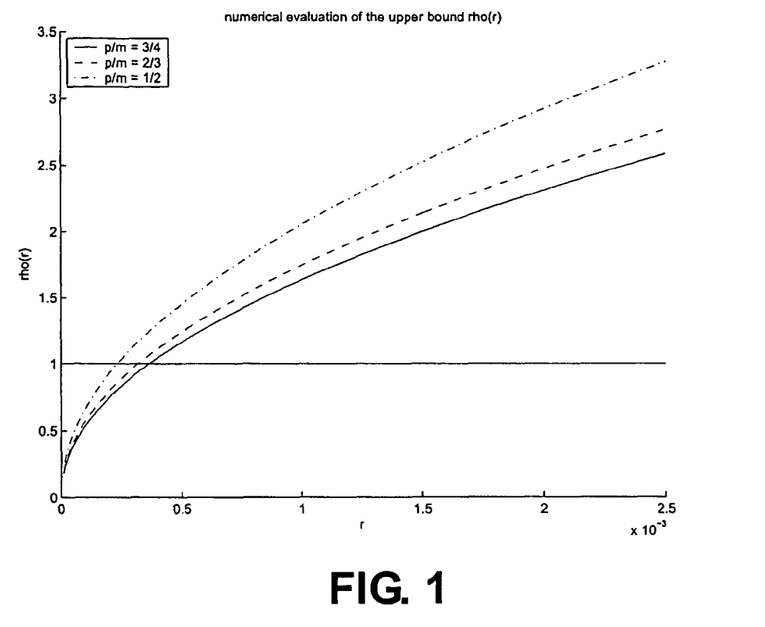
FIG. 1, used to illustrate Lemma 8, shows the behaviour of the upper bound $\rho_{p/m}(r)$ for the three values of the ratio p/m, namely p/m=¾, ⅔, ½

A similar conclusion holds for $\delta_{2S}$ and $\delta_{3S}$ and, therefore, we established that $$\delta_S + \delta_{2S} + \delta_{3S} < \rho_{p/m}(r), \quad (12)$$

$$\rho_{p/m}(r) = \sum_{j=1}^{3} -1+[1+f(jr)]^2.$$

with very high probability. In conclusion, Lemma 1 shows that the hypothesis of the applicants' main theorem holds provided that the ratio r=S/m be so small that $\rho_{p/m}(r)<1\$$. In other words, in the limit of large samples, S/m may be taken as any value obeying $\rho_{p/m}(S/m)<1$ which we used to give numerical values in Theorem 5. FIG. 1 graphs the function $\rho_{p/m}(r)$ for several values of the ratio p/m.

Numerical Experiments

This section investigates the practical ability of $l_1$ to decode an object $f \in R^n$ from corrupted encoded data y=Af+e, y $\in R^m$ (or equivalently, to recover the sparse vector of errors e $\in R^m$ from the underdetermined system of equations Fe=z $\in R^{m-n}$). The goal here is to evaluate empirically the location of the breakpoint as to get an accurate sense of the performance one might expect in practice. In order to do this, the applicants performed a series of experiments designed as follows:

1. select n (the size of the input signal) and m so that with the same notations as before, A is an n by m matrix; sample A with independent Gaussian entries;
2. select S as a percentage of m;
3. select a support set T of size |T|=S uniformly at random, and sample a vector e on T with independent and identically distributed Gaussian entries. (Just as in [5], the results presented here do not seem to depend on the actual distribution used to sample the errors.);
4. perform the noisy encoding ỹ=Ax+e of the data x (the choice of x does not matter as is clear from the discussion and here, x is also selected at random), apply the decoding procedure (P$_1$') and obtain x*,
5. compare x to x*;
6. repeat 100 times for each S and A;
7. repeat for various sizes of n and m.

Figure 2A:
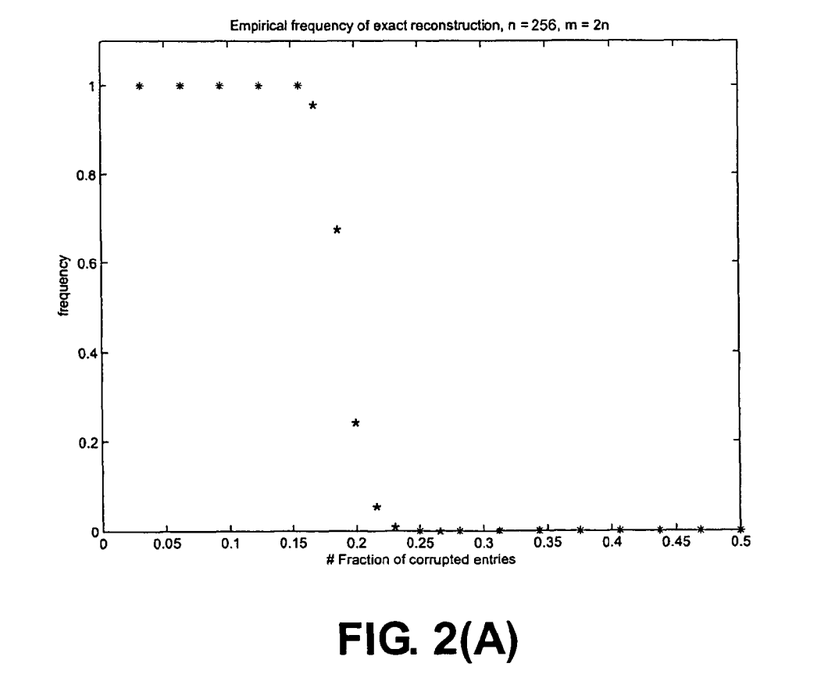
FIGS. 2(a) and 2(b) show $l_1$ recovery of an input signal from y=Af+e with A an m by n matrix with independent Gaussian entries. In this experiment, we 'oversample' the input signal by a factor of 2 so that m=2n. (a) Success rate of (P1) for m=512. (b) Success rate of (P1) for m=1024. Observe the similar pattern and cut-off point. In these experiments, exact recovery occurs as long as about 17% or less of the entries are corrupted.
Figure 2B:
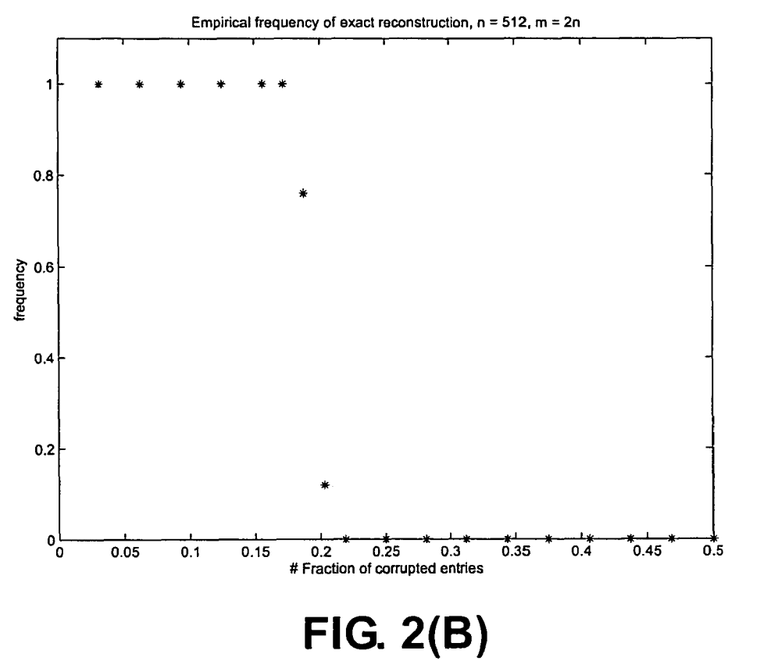
Figure 3:
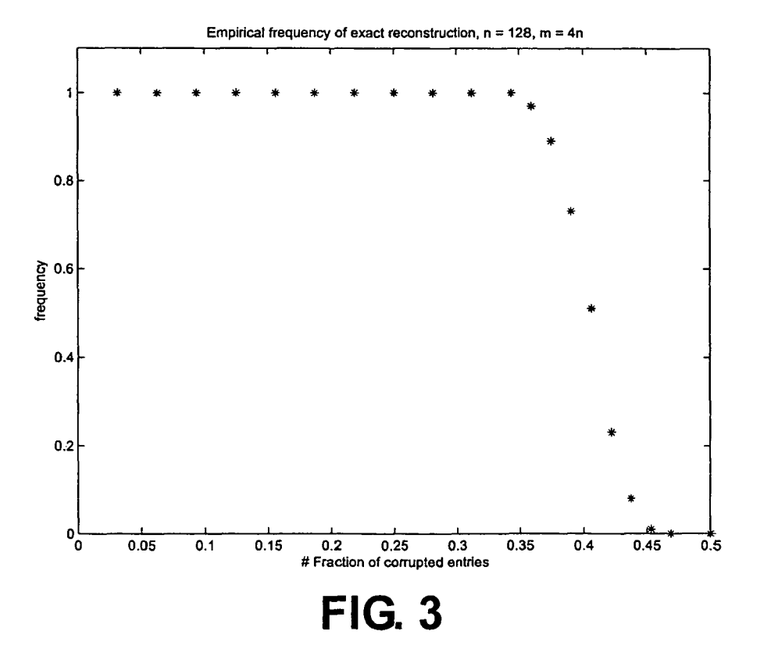
FIG. 3 shows $l_1$ recover of an input signal from y=Af+e with A an m by n matrix with independent Gaussian entries. In this experiment, the applicants 'oversample' the input signal by a factor 4, thus m=4n. In these experiments, exact recovery occurs as long as about 34% or less of the entries are corrupted.
Figure 4:
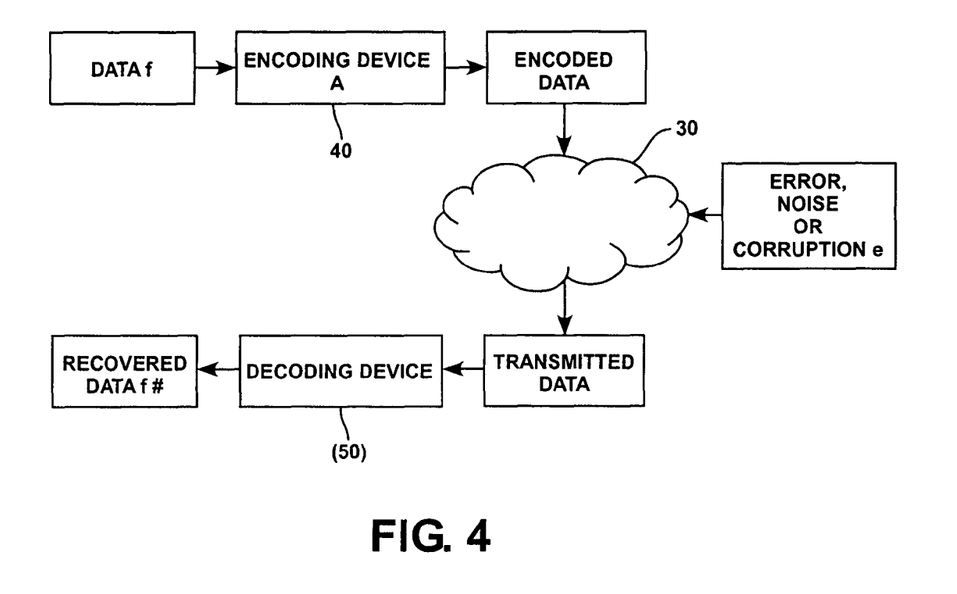
FIG. 4 describes abstractly how the encoding and decoding scheme could be implemented in practice, starting with arbitrary data or data packets f (10) and then obtaining decoded data or data packets f# (20) which will equal the original data f if the fraction of transmitted data that has been corrupted is below a certain threshold. For instance, the transmission could be done over the Internet (30) (with errors coming from packet loss or malicious corruption of data), with one computer (40) performing the encoding operation f↦Af and another computer (50) performing the decoding operation (P₁) or (P'₁). Alternatively, the transmission could be via physical data storage (30) (to a hard disk, CD or DVD, with the error now arising from physical damage to the storage device), with encoding and decoding again performed by computer. A third possibility is with the encoding performed by a large number of cheap (and not necessarily reliable) low-power electronic measurement devices, the transmission conducted over open air using some electromagnetic frequency (and thus subject to interference or attenuation), and the data then collected by some receiver and decoded by a computer.
Figure 5:
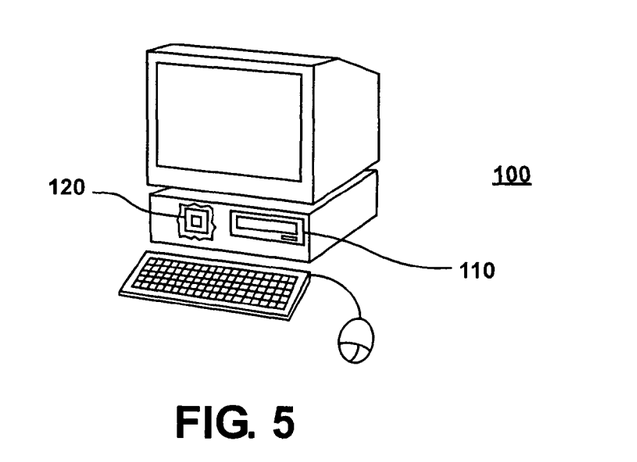

The results are presented in FIG. 2 and FIG. 3. FIG. 2 examines the situation in which the length of the code is twice that of the input vector m=2n, for m=512 and m=1024. The applicants' experiments show that one recovers the input vector all the time as long as the fraction of the corrupted entries is below 17%. This holds for m=512 (FIG. 2(a)) and m=1024 (FIG. 2(b)). In FIG. 3, the applicants investigate how these results change as the length of the codewords increases compared to the length of the input, and examine the situation in which m=4n, with m=512. The applicants' experiments show that one decodes the input vector all the time as long as the fraction of the corrupted entries is below 34%.

Optimal Signal Recovery

The applicants' recent work [4] developed a set of ideas showing that it is surprisingly possible to reconstruct interesting classes of signals accurately from highly incomplete measurements. The results in the present application are inspired and improve upon this earlier work and the applicants now elaborate on this connection. Suppose one wishes to reconstruct an object $\alpha \in R^m$ from the K linear measurements $$y_k \langle \alpha, \phi_k \rangle k=1, \ldots K, \text{ i.e. } y=F\alpha, \quad (13)$$

with $\phi_k$ equal to the $k^{th}$ row of the matrix F. Of special interest is the vastly underdetermined case, K<<N, where there are many more unknowns than observations. The applicants choose to formulate the problem abstractly but for concreteness, one might think of $\alpha$ as the coefficients $\alpha := \Psi^* f$ of a digital signal or image f in some nice orthobasis, e.g. a wavelet basis so that the information about the signal is of the form $y=F\alpha=F\Psi^* f$.

Suppose now that the object of interest is compressible in the sense that the reordered entries of $\alpha$ decay like a power-law; concretely, suppose that the entries of $\alpha$, rearranged in decreasing order of magnitude, $|\alpha|_{(1)} \geq |\alpha|_{(2)} \geq \ldots \geq |\alpha|_{(m)}$, obey $$|\alpha|_{(k)} \leq B \cdot k^{-s} \quad (14)$$

for some $s \geq 1$. The applicants will denote by $F_s(B)$ the class of all signals $\alpha \in R^m$ obeying (14). The claim is that it is possible to reconstruct compressible signals from only a small number of random measurements.

Theorem 9. Let F be the measurement matrix as in (13) and consider the solution $\alpha^\#$ to $$\min_{\tilde{\alpha} \in R^m} \|\tilde{\alpha}\|_{l_1}$$

subject to $F\tilde{\alpha}=y$. Let $S \leq K$ such that $\delta_S 2\theta_S + \theta_{S,2S} < 1$ and set $\lambda := K/S$. Then $\alpha^\#$ obeys $$\sup_{\alpha \in F_s(B)} \|\alpha - \alpha^\#\| \leq C \cdot (K/\lambda)^{-(s-1/2)}. \quad (15)$$

To appreciate the content of the theorem, suppose one would have available an oracle letting us know which coefficients $\alpha_k, 1 \leq k \leq m$, are large (e.g. in the scenario we considered earlier, the oracle would tell us which wavelet coefficients of f are large). Then we would acquire information about the K largest coefficients and obtain a truncated version $\alpha_K$ of $\alpha$ obeying $$\|\alpha - \alpha_K\| \leq c \cdot K^{-(s-1/2)},$$

for generic elements taken from $F_S(B)$. Now (15) says that not knowing anything about the location of the largest coefficients, one can essentially obtain the same approximation error by non-adaptive sampling, provided the number of measurements be increased by a factor $\lambda$. The larger S, the smaller the oversampling factor, and hence the connection with the decoding problem. Such considerations make clear that Theorem 9 supplies a very concrete methodology for recovering a compressible object from limited measurements and as such, it may have a significant bearing on many fields of science and technology. The applicants refer the reader to [4] and [10] for a discussion of its implications.

Suppose for example that F is a Gaussian random matrix as discussed in an earlier section. We will assume the same special normalization so that the variance of each individual entry is equal to 1/K. Calculations identical to those from earlier sections give that with overwhelming probability, F obeys the hypothesis of the theorem provided that $$S \leq K/\lambda, \lambda = \rho \cdot \log(m/K),$$

for some positive constant $\rho > 0$. Now consider the statement of the theorem; there is a way to invoke linear programming and obtain a reconstruction based upon O(K log m/K) measurements only, which is at least as good as that one would achieve by knowing all the information about f and selecting the K largest coefficients. In fact, this is an optimal statement as (15) correctly identifies the minimum number of measurements needed to obtain a given precision. In short, it is impossible to obtain a precision of about $K^{-(s-1/2)}$ using only O(K log m/K) measurements, see [4,10].

Theorem 9 is stronger than the applicants' former result, namely, Theorem 1.4 in [4]. To see why this is true, recall the former claim: [4] introduced two conditions, the uniform uncertainty principle (UUP) and the exact reconstruction principle (ERP). In a nutshell, a random matrix F obeys the UUP with oversampling factor $\lambda$ if F obeys $$\delta_S \leq \frac{1}{2}, S = \rho \cdot K/\lambda, \quad (16)$$

with probability at least $1 - O(N^{-\gamma/\rho})$ for some fixed positive constant $\gamma > 0$. Second, a measurement matrix F obeys the ERP with oversampling factor $\lambda$ if for each fixed subset T of size $|T| \geq S$ (16) and each "sign" vector c defined on T, there exists with the same overwhelmingly large probability a vector $w \in H$ with the following properties:

1. z,904 w,v$_j$z,905 $_H$=c$_j$, for all j ∈ T.

2. and |z,904 w,v$_j$z,905 $_H$|<½ for all j not in T.

Note that these are the conditions 1, 2 studied in previous sections, except for the ½ factor on the complement of T. Fix $\alpha \in F_s(B)$. In [4] it was argued that if a random matrix obeyed the UUP and the ERP both with oversampling factor $\lambda$, then $$\|\alpha - \alpha^\#\| \leq C \cdot (K/\lambda)^{-(s-1/2)},$$

with inequality holding with the same probability as before. Against this background, several comments are now in order:

First, the new statement is more general as it applies to all matrices, not just random matrices.

Second, whereas the applicants' previous statement argued that for each $\alpha \in R^m$, one would be able—with high probability—to reconstruct a $\alpha$ accurately, it did not say anything about the worst case error for a fixed measurement matrix F. This is an instance where the order of the quantifiers plays a role. Do we need different F's for different objects? Theorem 9 answers this question unambiguously; the same F will provide an optimal reconstruction for all the objects in the class.

Third, Theorem 9 says that the ERP condition is redundant, and hence the hypothesis may be easier to check in practice. In addition, eliminating the ERP isolates the real reason for success as it ties everything down to the UUP. In short, the ability to recover an object from limited measurements depends on how close F is to an orthonormal system, but only when restricting attention to sparse linear combinations of columns.

The applicants will not prove this theorem as this is a minor modification of that of Theorem 1.4 in the aforementioned reference. The key point is to observe that if F obeys the hypothesis of the applicants' theorem, then by definition F obeys the UUP with probability one, but F also obeys the ERP, again with probability one, as this is the content of Lemma 7. Hence both the UUP and ERP hold and therefore, the conclusion of Theorem 9 follows. (The fact that the ERP actually holds for all sign vectors of size less than S is the reason why (15) holds uniformly over all elements taken from $F_s(B)$, see [4].)

Discussion

Improvements

More elaborate arguments can yield versions of Theorem 5 with tighter bounds. Immediately following the proof of Lemma 7, we already remarked that one might slightly improve the condition (4) at the expense of considerable complications. The applicants will now discuss improvements in this direction using tools from Random Matrix Theory.

The applicants' main hypothesis in (4) reads $\delta_S + \theta_S + \theta_{S,2S} < 1$, but in order to reduce the problem to the study of those $\delta$ numbers (and use known results), the applicants' analysis actually relied upon the more stringent condition $\delta_S + \delta_{2S} + \delta_{3S} < 1$ instead, since $$\delta_S + \theta_S + \theta_{S,2S} \leq \delta_S + \delta_{2S} + \delta_{3S}.$$

This introduces a gap. Consider a fixed set T of size $|T|=S$. Using the notation of previous sections, the applicants argued that $$\delta(F_T) \approx 2\sqrt{S/p} + S/p,$$

and developed a large deviation bound to quantify the departure from the right hand-side. Now let T and T' be two disjoint sets of respective sizes S and S' and consider $\theta(F_T, F_{T'})$, which is the cosine of the principal angle between the two random subspaces spanned by the columns of $F_T$ and $F_{T'}$ respectively; formally $$\theta(F_T, F_{T'}) := \sup \langle u, u' \rangle u \in \text{span}(F_T), u' \in \text{span}(F_{T'}), \|u\|=\|u'\|=1.$$

The applicants remark that this quantity plays an important analysis in statistical analysis because of its use to test the significance of correlations between two sets of measurements, compare the literature on *Canonical Correlation Analysis* [20]. Among other things, it is known [25] that $$\theta(F_T, F_{T'}) \to \sqrt{\gamma(1-\gamma')} + \sqrt{\gamma'(1-\gamma)} \text{ a.s.}$$

as $p \to \infty$ with $S/p \to \gamma$ and $S'/p \to \gamma'$. In other words, whereas we used the limiting behaviors $$\delta(F_{2T}) \to 2\sqrt{2\gamma} + 2\gamma, \delta(F_{3T}) \to 2\sqrt{3\gamma} + 3\gamma,$$

there is a chance one might employ instead $$\theta(F_T, F_T) \to 2\sqrt{\gamma(1-\gamma)}, \theta(F_T, F_{T'}) \to \sqrt{\gamma(1-2\gamma)} + \sqrt{2\gamma(1-\gamma)}$$

for $|T|=|T'|=S$ and $|T'|=2|T|=2S$ respectively, which is better. Just as in previous sections, one might then look for concentration inequalities transforming this limiting behavior into corresponding large deviation inequalities. Recent work of Johnstone and his colleagues [17] might be of help here.

Finally, tighter large deviation bounds might exist together with more clever strategies to derive uniform bounds (valid for all T of size less than S) from individual bounds (valid for a single T). With this in mind, it is interesting to note that the applicants' approach hits a limit as $$\liminf_{\substack{S \to \infty \\ S/m \to r}} \sigma_S + \theta_S + \theta_{S,2S} \geq J\left(\frac{m}{p} \cdot r\right), \quad (17)$$

where $J(r) := 2\sqrt{r} + r + (2+\sqrt{2})\sqrt{r(1-r)} + \sqrt{r(1-2r)}$. Since $J(r)$ is greater than 1 if and only if $r > 2.36$, one would certainly need new ideas to improve Theorem 5 beyond cut-off point in the range of about 2%. The lower limit (17) is probably not sharp since it does not explicitly take into account the ratio between m and p; at best, it might serve as an indication of the limiting behavior when the ratio p/m is not too small.

Other Coding Matrices

The present application introduced general results stating that it is possible to correct for errors by $l_1$-minimization. We then explained how the results specialize in the case where the coding matrix A is sampled from the Gaussian ensemble. It is clear, however, that an expert in these methods could use other matrices and still obtain similar results; namely, that $(P_1')$ recovers f exactly provided that the number of corrupted entries does not exceed $\rho \cdot m$. In fact, the applicants' previous work suggests that partial Fourier matrices would enjoy similar properties [5,4]. Other candidates might be the so-called noiseless of Coifman, Geshwind and Meyer [7]. These alternative might be of great practical interest because they would come with fast algorithms for applying A or A* to an arbitrary vector g and, hence, speed up the computations to find the $l_1$-minimizer.

Conclusions

The present disclosure is about the classical error correcting problem which is frequently discussed in communication and coding theory, The problem is as follows: a vector $f \in R^n$ (i.e. a sequence $f = (f_1, f_2, \ldots, f_n)$ of n real numbers) is encoded and then transmitted using a linear code, i.e. a collection of codewords which are vectors $a_1, a_2, \ldots, a_n \in R^m$ —the columns of a matrix A. Given a vector $f \in R^n$ (the "plaintext") we can then generate a vector Af in $R^m$ (the "ciphertext"). A recurrent problem with real communication or storage devices is that some of the entries of the ciphertext Af may become corrupted; when this is the case, the corrupted entries are unreliable and may have nothing to do with the original values. In general, it is not known which entries are affected, nor is it known how they are affected. The applicants' disclosure shows that no matter what the corruption is like, it is provably possible to decode the plaintext from the corrupted ciphertext by solving a convenient linear program, with success guaranteed as long as that the fraction of corrupted entries in not excessively large. The algorithm proceeds by solving the convex optimization program $$\min_{x \in R^n} \|y - Ax\|_{l_1},$$

where y is the vector of corrupted encoded data and $$\|x\|_{l_1} := \sum_i |x_i|.$$

The following are two key features of the decoding algorithm presented in this disclosure:

1. Tractability. The optimization program is equivalent a linear program (1). This observation is of practical significance since it enables large scale decoding problems to be solved rapidly and efficiently using standard off-the-shelf optimization software.
2. Performance. The applicants performed numerical experiments which show that in practice, the decoding algorithm of the present disclosure works extremely well when the coding matrix is generated at random. Suppose for example, that the number of codewords m is 4 times the length of the plaintext (m=4n). The applicants' numerical experiments have shown that the plaintext is recovered exactly all the time as long as the fraction of the corrupted entries is below about 34% of the size of the ciphertext. (In contrast, it is known that accurate decoding is impossible if the corruption rate is 50% or higher).

This invention has many potential applications as efficient error-correction codes are in widespread use in many fields of technology. Examples include the transmission of Internet media, Internet telephony, and speech transmission. In addition, error correction is embedded as a key building block in numerous algorithms, and data-structures, where corruption is possible; corruption of digital data stored on a hard-drive, CD, DVD or similar media is a good example. In short, progress in error correction has potential to impact several storage and communication systems.

Where several illustrative embodiments of the invention have been shown and described above, numerous variations and alternative embodiments will occur to experts. Such variations and alternative embodiments are contemplated and can be made without departing from the scope of the invention as defined in the appended claims.

REFERENCES

[1] Z. D. Bai and Y. Q. Yin. *Limit of the smallest eigenvalue of a large-dimensional sample covariance matrix.* Ann. Probab. 21 (1993), 1275-1294.
[2] S. Boyd, and L. Vandenberghe, *Convex Optimization*, Cambridge University Press, 2004.
[3] E. J. Candès, J. Romberg, and T. Tao, *Robust uncertainty principles: exact signal reconstruction from highly incomplete frequency information.* To appear, IEEE Transactions on Information Theory. Available at http://arxiv.org/abs/math.NA/0409186
[4] E. J. Candès, and T. Tao, *Near optimal signal recovery from random projections: universal encoding strategies?* Submitted to IEEE Transactions on Information Theory, October 2004. Available at http://arxiv.org/abs/math.CA/0410542
[5] E. J. Candès, and J. Romberg, *Quantitative Robust Uncertainty Principles and Optimally Sparse Decompositions.* To appear, Foundations of Computational Mathematics, November 2004. Available at http://arxiv.org/abs/math.CA/0411273
[7] S. S. Chen. *Basis Pursuit.* Stanford Ph.~D.~Thesis, 1995.
[6] S. S. Chen, D. L. Donoho, and M. A. Saunders. *Atomic decomposition by basis pursuit.* SIAM J. Scientific Computing 20 (1999), 33-61.
[7] R. Coifman, F. Geshwind, and Y. Meyer. *Noiselets.* Appl. Comput. Harmon. Anal. 10 (2001), 27-44.
[8] K. R. Davidson and S. J. Szarek. *Local operator theory, random matrices and Banach spaces.* In: Handbook in Banach Spaces, Vol I, ed. W. B. Johnson, J. Lindenstrauss, Elsevier (2001), 317-366.
[9] D. L. Donoho. *For Most Large Underdetermined Systems of Linear Equations the Minimal $l_1$-norm Solution is also the Sparsest Solution.* Manuscript, September 2004. Available at http://www-stat.stanford.edu/~donoho/reports.html
[10] D. L. Donoho, *Compressed Sensing*, Manuscript, September 2004. Available at http://www-stat.stanford.edu/~donoho/reports.html
[11] D. L. Donoho and X. Huo. *Uncertainty principles and ideal atomic decomposition.* IEEE Transactions on Information Theory, 47 (2001), 2845-2862.
[12] D. L. Donoho and M. Elad. *Optimally sparse representation in general (nonorthogonal) dictionaries via $l_1$ minimization*, Proc. Natl. Acad. Sci. USA, 100 (2003), 2197-2202.
[13] M. Elad and A. M. Bruckstein. *A generalized uncertainty principle and sparse representation in pairs of $R^N$ bases.* IEEE Transactions on Information Theory, 48 (2002), 2558-2567.
[14] N. El Karoui. *New Results about Random Covariance Matrices and Statistical Applications.* Stanford Ph.D. Thesis, August 2004.
[15] S. Geman. *A limit theorem for the norm of random matrices.* Ann. Probab. 8 (1980), 252-261.
[16] R. Gribonval and M. Nielsen. *Sparse representations in unions of bases.* IEEE Trans. Inform. Theory 49 (2003), 3320-3325.
[17] I. M. Johnstone. *Large covariance matrices.* Third 2004 Wald Lecture, 6th World Congress of the Bernoulli Society and 67th Annual Meeting of the IMS, Barcelona, July 2004.
[18] M. Ledoux. *The concentration of measure phenomenon.* Mathematical Surveys and Monographs 89, American Mathematical Society, Providence, R.I., 2001.
[19] V. A. Marchenko and L. A. Pastur. *Distribution of eigenvalues in certain sets of random matrices.* Mat. Sb. (N.S.)} 72 (1967), 407-535 (in Russian).
[20] R. J. Muirhead. *Aspects of multivariate statistical theory.* Wiley Series in Probability and Mathematical Statistics. John Wiley & Sons, Inc., New York, 1982.
[21] B. K. Natarajan. *Sparse approximate solutions to linear systems.* SIAM J. Comput. 24 (1995), 227-234.
[22] J. W. Silverstein. *The smallest eigenvalue of a large dimensional Wishart matrix.* Ann. Probab. 13 (1985), 1364-1368.
[23] S. J. Szarek. *Condition numbers of random matrices.* J. Complexity 7 (1991), 131-149.
[24] J. A. Tropp. *Greed is good: Algorithmic results for sparse approximation.* Technical Report, the University of Texas at Austin, 2003.
[25] K. W. Wachter. *The limiting empirical measure of multiple discriminant ratios.* Ann. Statist. 8 (1980), 937-957.

What is claimed is:

1. A computer-implemented method for correcting transmission errors, comprising the steps of:
   transmitting a vector encoded through an encoding device using a linear code, said vector becoming corrupted by error upon transmission; and decoding the corrupted vector through a decoding device and correcting the corrupted vector so as to recover the vector, said corrupted vector being corrected by solving a linear program in form of a convex optimization problem $$\min_{x \in R^n} \|y - Ax\|_{l_1},$$

wherein y is the corrupted vector, A is a coding matrix expressing the linear code, and $l_1$ is a norm such that $$\|x\|_{l_1} := \sum_i |x_i|.$$

2. The computer-implemented method of claim 1, wherein the coding matrix is a random matrix.

3. The computer-implemented method of claim 1, wherein the coding matrix is sampled from a Gaussian ensemble.

4. The computer-implemented method of claim 1, wherein the step of transmitting the vector is a step of transmitting a vector describing a physical system.

5. The computer-implemented method of claim 1, further comprising the step of including in the vector data relating to a field selected from Internet media, Internet telephony and speech transmission.

6. A computer program for simulating a physical process, the computer program residing on a storage device, for a system comprising a processor, a memory and an input device, the computer program comprising instructions for causing the processor to perform a method according to claim 1.

7. A method for transmitting packets over a communication network comprising:
encoding the packets through an encoding device using a coding matrix;
transmitting the encoded packets, wherein during transmission the packets become corrupted; and
decoding through a decoding device and correcting the transmitted corrupted packets by solving a linear program $$\min_{x \in R^n} \|y - Ax\|_{l_1},$$

wherein A is the coding matrix, y is a vector expressing the transmitted encoded packets and $l_1$ represents a norm such that $$\|x\|_{l_1} := \sum_i |x_i|.$$

* * * * *

UNITED STATES PATENT AND TRADEMARK OFFICE
CERTIFICATE OF CORRECTION

| | | |
|---|---|---|
| PATENT NO. | : 7,890,842 B2 | Page 1 of 1 |
| APPLICATION NO. | : 11/344951 | |
| DATED | : February 15, 2011 | |
| INVENTOR(S) | : Emmanuel Candes et al. | |

It is certified that error appears in the above-identified patent and that said Letters Patent is hereby corrected as shown below:

In Column 1, lines 16-19, the wording should appear as follows:

This invention was made with U.S. Government support under grant no. DMS 01-40698 (FRG) awarded by the National Science Foundation and grant no. DE-FG03-02ER25529 awarded by the Department of Energy. The U.S. Government has certain rights in this invention.

Signed and Sealed this
Twenty-ninth Day of March, 2011

David J. Kappos
*Director of the United States Patent and Trademark Office*